United States Patent [19]

Podell et al.

[11] Patent Number: 4,937,541
[45] Date of Patent: Jun. 26, 1990

[54] LOADED LANGE COUPLER

[75] Inventors: Allen F. Podell, Palo Alto; Ravi Ramachandran, Sunnyvale, both of Calif.

[73] Assignee: Pacific Monolithics, Sunnyvale, Calif.

[21] Appl. No.: 369,475

[22] Filed: Jun. 21, 1989

[51] Int. Cl.$^5$ .............................................. H01P 5/18
[52] U.S. Cl. ...................................... 333/116; 333/238
[58] Field of Search .......................... 333/109, 115, 116

[56] References Cited

U.S. PATENT DOCUMENTS

| | | | |
|---|---|---|---|
| 3,012,210 | 12/1961 | Nigg | 333/116 |
| 3,162,717 | 12/1964 | Lentz . | |
| 3,332,039 | 7/1967 | Oh . | |
| 3,516,024 | 6/1970 | Lange . | |
| 4,375,054 | 2/1983 | Pavio | 333/116 |
| 4,376,921 | 3/1983 | Dickens et al. | 333/116 |
| 4,482,873 | 11/1984 | Nyhus | 333/116 |
| 4,636,754 | 1/1987 | Presser et al. | 333/116 |
| 4,800,345 | 1/1989 | Podell et al. | 333/111 |

OTHER PUBLICATIONS

Lange, "Interdigitated Strip-Line Quadrature Hybrid", *MTTS Digest of Technical Papers*, Dallas, TX, 5/5-7/69, pp. 10-13.
Waterman, Jr. et al., "GaAs Monolithic Lange and Wilkinson Couplers", *IEEE Transactions on Electron Devices*, vol. ED-28, No. 2, Feb. 1981, pp. 212-216.
Brehm et al., "Monolithic GaAs Lange Coupler as X-Band", *IEEE Transactions on Electron Devices*, vol. Ed-28, No. 2, Feb. 1981, pp. 217-218.
Tajima et al., "Monolithic Hybrid Quadrature Couplers (Braided Structures)", *IEEE GaAs IC Symposium*, 1982, pp. 154-155.
Kumar et al., "Monolithic GaAs Interdigitated Couplers", *IEEE*, 1983, pp. 359-362.
Kemp et al., "Ultra-Wideband Quadrature Coupler", *IEEE Transactions*, 1983, pp. 197-199.
Shibata et al., "Microstrip Spiral Directional Coupler", *IEEE Transactions*, 1981, pp. 680-689.

*Primary Examiner*—Paul Gensler
*Attorney, Agent, or Firm*—Edward B. Anderson

[57] ABSTRACT

A loaded Lange coupler embodied as an integrated circuit includes interdigitated strip conductors and lumped-element capacitors. The two interdigitated strip conductors couple the input and direct ports together, and the isolated and coupled ports together. A capacitor extends between each of the input and coupled ports and the isolated and direct ports. Further, a capacitor extends between each of the midpoints of the strip conductors and ground. This coupler is formed as an integrated circuit in which the current-to-ground capacitors are substantially in line between opposite port pairs and the strip conductors extend around these capacitors.

8 Claims, 2 Drawing Sheets

LOADED LANGE COUPLER

FIELD OF THE INVENTION

This invention relates to quadrature couplers, and particularly to impedance-loaded Lange couplers.

BACKGROUND AND SUMMARY OF THE INVENTION

Couplers of many types and variations have been developed for circuits processing signals at microwave frequencies. U.S. Pat. No. 3,516,024 was issued on June 2, 1970 to Lange for an Interdigitated Strip Line Coupler. This coupler, also described in Lange, "Interdigitated Strip-Line Quadrature Hybrid", *MTTS Digest of Technical Papers*, Dallas, Texas, May 5-7, 1969, pp. 10-13, has become generally known as a Lange coupler. Since this early work on strip line conductors many variations have been developed. These are variously described in Waterman, Jr., et al., "GaAs Monolithic Lange and Wilkinson Couplers", and Brehm et al., "Monolithic GaAs Lange Coupler at X-Band", both of *IEEE Transactions on Electron Devices*, Vol. ED-28, No. 2, February 1981, pages 212-216, and pages 217-218, respectively; Tajima et al., "Monolithic Hybrid Quadrature Couplers (Braided Structures)", *IEEE GaAs IC Symposium*, 1982, pages 154 and 155; Kumar et al., "Monolithic GaAs Interdigitated Couplers", *IEEE*, 1983, pages 359-362; Kemp et al., "Ultra-Wideband Quadrature Coupler", *IEEE Transactions*, 1983, pp. 197-199; Shibata et al., "Microstrip Spiral Directional Coupler", *IEEE Transactions*, 1981, pp. 680-689; Lentz, "Compact Transmission Line Consisting of Interleaved Conductor Strips and Shield Strips", U.S. Pat. No. 3,162,717 issued Dec. 22, 1964; Oh, "Three Conductor Coplanar Serpentine-line Directional Coupler", U.S. Pat. No. 3,332,039 issued Jul. 18, 1967; Presser et al., "High Performance Interdigitated Coupler with Additional Jumper Wire", U.S. Pat. No. 4,636,754 issued Jan. 13, 1987; and Podell et al., "Spiral Hybrid Coupler", U.S. Pat. No. 4,800,345 issued Jan. 24, 1989.

These various forms of interdigitated and strip-line conductors provide coupling with various degrees of success. However, there remains the need for a coupler having the simplicity of a Lange coupler but with reduced size and improved performance.

The present invention provides this with a Lange coupler having lumped impedances coupled to it. More specifically, the present invention provides a quadrature coupler comprising input, direct, coupled and isolated ports. A first strip conductor couples the input and direct ports. A second strip conductor couples the isolated and coupled ports.

Lumped-element capacitance is added to the strip conductors. For example, in the preferred embodiment of the invention, an interport capacitor is added between the input and coupled ports, and another interport capacitor is added between the direct and isolated ports. Also, a capacitor is coupled between an intermediate point of each strip conductor and a reference voltage, such as ground. These added capacitors improve the velocity equalization of the even-and-odd modes of the coupler while foreshortening it by approximately a factor of two.

The performance of this size reduced and improved Lange coupler is apparent in that the direct and coupled ports are closely coupled over a broad microwave frequency band. Further, the return loss and isolation are very low over the same frequency band. Thus, a coupler having effective coupling performance, small size and simple design is provided. These and other advantages and features of the invention are apparent from the preferred embodiment disclosed in the following detailed description and the associated drawings.

DETAILED DESCRIPTION OF THE PREFERRED EMBODIMENT

Figure 1:
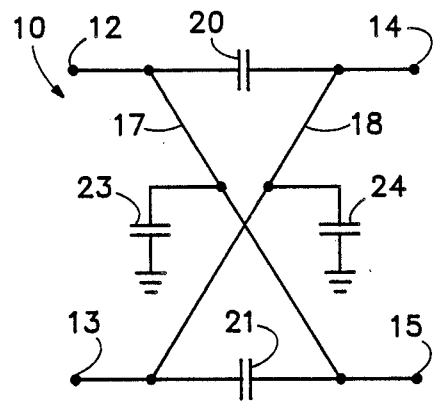
FIG. 1 is a circuit schematic of a basic quadrature coupler made according to the invention.

A hybrid quadrature coupler 10 made according to the present invention is shown in FIG. 1. Coupler 10 comprises four ports 12, 13, 14 and 15, which variously are the input, isolated, coupled, and direct ports, depending on the application. Strip conductors 17 and 1B extend between ports 12 and 15, and ports 13 and 14, respectively.

A pair of interport capacitors 20 and 21 are connected between the ports, as shown. More specifically, capacitor 20 is connected between ports 12 and 14, and capacitor 21 is connected between ports 13 and 15.

Further, a capacitor 23 extends between a reference voltage, preferably ground potential, and a point on conductor strip 17. Similarly, a capacitor 24 couples a central point of conductor strip 18 to ground.

Figure 2:
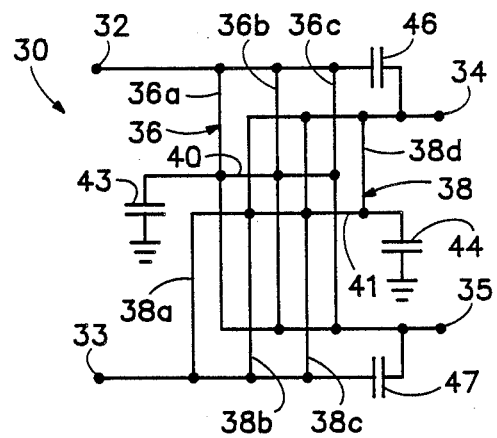
FIG. 2 is a circuit schematic of a quadrature coupler similar to FIG. 1 but having interdigitated strip conductors.

An interdigitated quadrature coupler 30 shown in FIG. 2 embodies the features of coupler 10. Coupler 30 was constructed as an integrated circuit using conventional fabrication techniques to form the structure represented in plan view in FIG. 3. The active elements and connections are shown in the figure. Associated films and substrates of semi-insulating material, not shown, separate the visible from the nonvisible elements and from the grounding layer on the lower surface of the primary substrate.

Coupler 30 again comprises ports 32, 33, 34 and 35. A first strip conductor, shown generally at 36, comprises individual conductor sections 36a, 36b and 36c. These conductor sections are interdigitated with corresponding conductor sections 38a, 38b, 38c and 38d of a strip conductor 38. Sections 38a and 38d are half-length sections. The length of the strip conductors, normally one-quarter of a design wavelength without added lumped capacitors, is approximately one-eighth of a design wavelength, which in this preferred embodiment is based on a center frequency of 9 GHz. All of the sections of each strip conductor are connected by respective ties 40 and 41 at a central point of the strip conductor. These ties are each coupled to ground via respective 0.227 pf capacitors 43 and 44.

Interport capacitors 46 and 47, each having a value of 0.637 pf, are connected between ports 32 and 34 and between ports 33 and 35, respectively, as shown.

The capacitance values used result in an impedance at each port of about 17 ohms. Thus, this circuit is very useful for coupling circuits, such as in interstage applications, having impedances of between 12 and 25 ohms.

Figure 3:
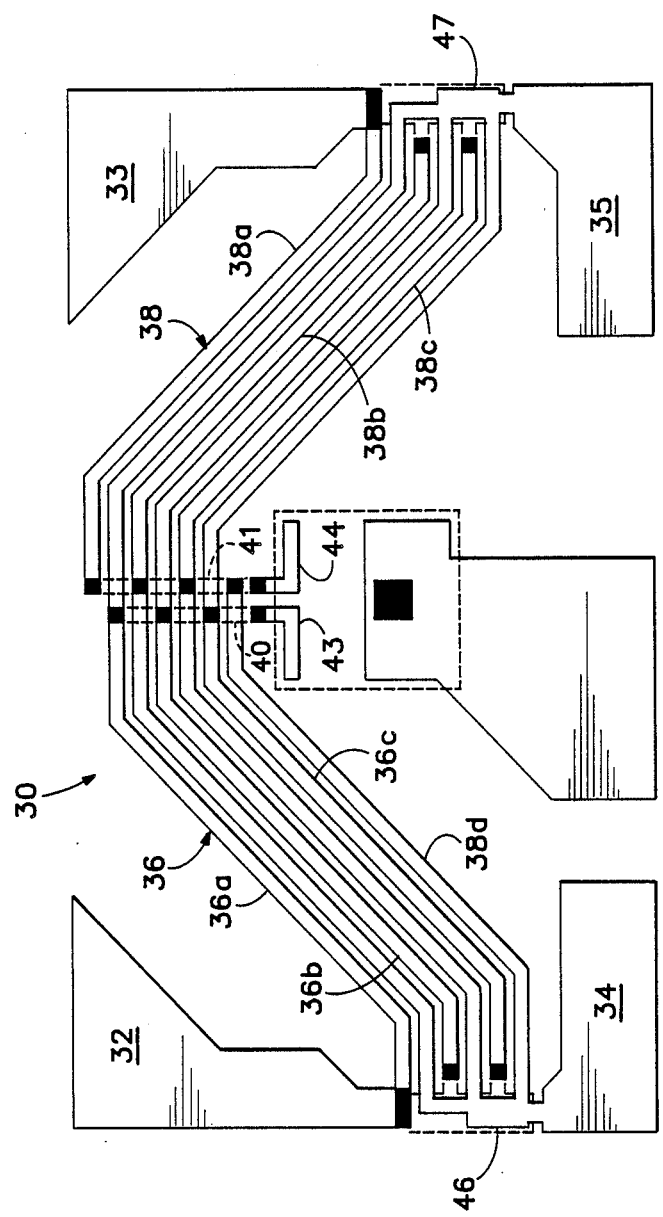
FIG. 3 is a plan view of the circuit of FIG. 2 embodied as an integrated circuit.

It will further be seen from viewing FIG. 3, that the capacitors 43 and 44 of this particular embodiment are positioned generally in line with the opposite port pairs. The strip conductors extend around and are spaced from these capacitors, thereby making the physical circuit even more compact than if used in conventional Lange coupler rectilinear form. The embodiment shown can be formed on a 48×24 mil chip. Conventional Lange couplers would require a length of about 120 mils. The length between the ends of the strip conductors in this embodiment is about 60 mils.

Figure 4:
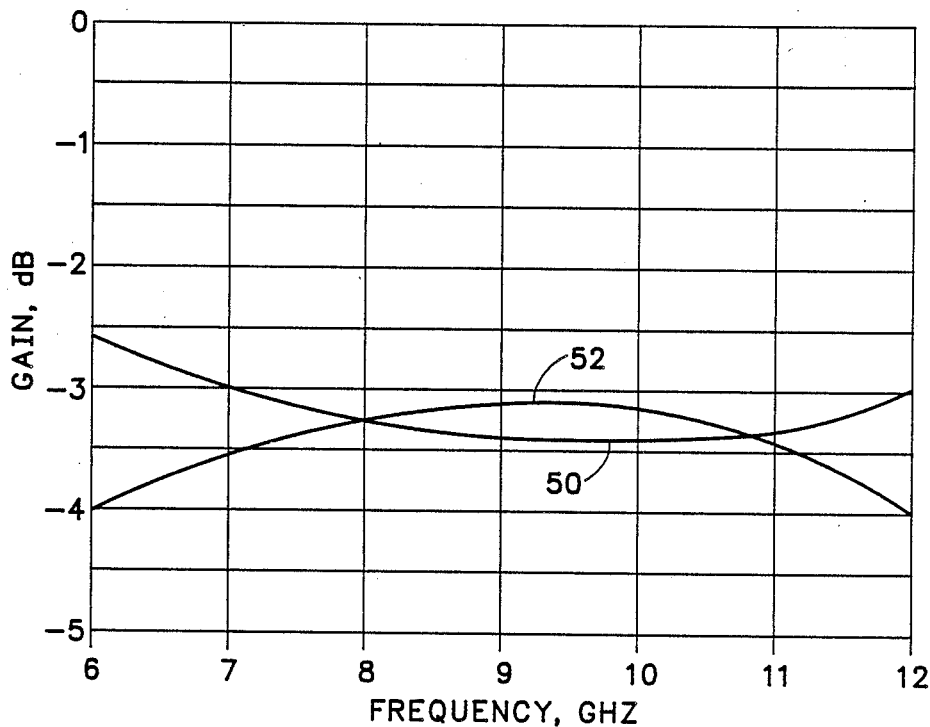
FIG. 4 is a plot of signal magnitude as a function of frequency for the coupler of FIG. 3.

FIG. 4 shows the gain of coupler 30 over a frequency range extending from 6 GHz to 12 GHz. Curve 50 represents the gain at the direct port, and curve 52 represents the gain at the coupled port. It can be seen that the coupler is very closely coupled over the frequency band 7 GHz to 11 GHz.

Figure 5:
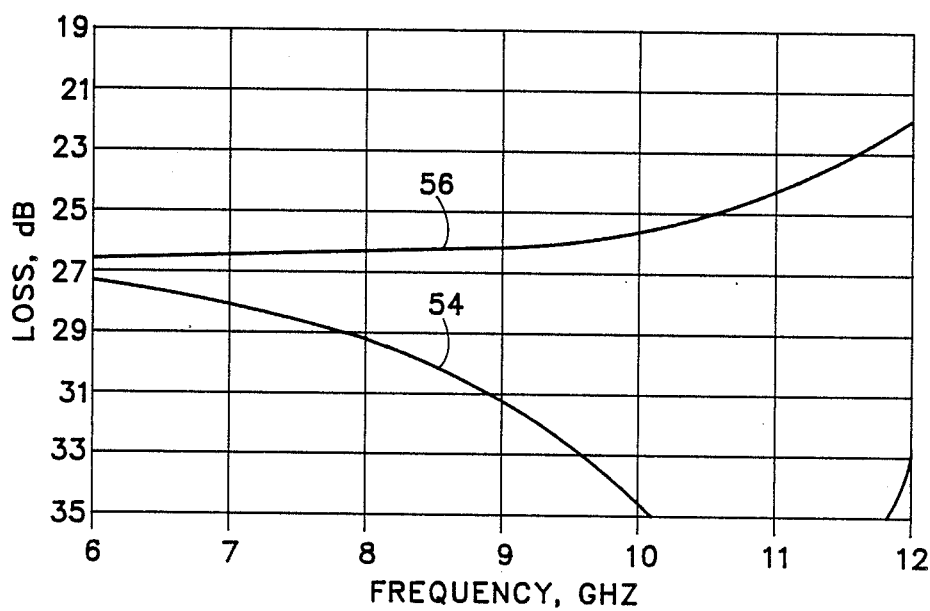
FIG. 5 is a plot of isolation and return loss as a function of frequency for the coupler of FIG. 3.

Curve 54 in FIG. 5 shows that the input return loss over the frequency band shown is less than 27 dB. The isolation, shown by curve 56, is less than 20 dB.

It will be appreciated that although the invention has been described with reference to a preferred embodiment, variations in design and structure may be made without varying from the spirit and scope of the invention as defined in the claims. For instance, the capacitors may be in the form of varactor diodes with the capacitance being determined by the bias on the diode.

We claim:

1. A quadrature coupler comprising:
    input, direct, coupled and isolated ports;
    a first strip conductor coupling the input and direct ports;
    a second strip conductor coupling the isolated and coupled ports;
    first capacitor means coupled between the input and coupled ports;
    second capacitor means coupled between the direct and isolated ports;
    third capacitor means coupled between an intermediate point of the first strip conductor and a reference voltage; and
    fourth capacitor means coupled between an intermediate point of the second strip conductor and the reference voltage.

2. A coupler according to claim 1 wherein the strip conductors are formed of interdigitated parallel strip conductor sections.

3. A coupler according to claim 2 wherein the strip conductors are coplanar and each of the third and fourth capacitor means comprises spaced planar pad conductors with the planes of the pad conductors being parallel with the plane of the strip conductors.

4. A coupler according to claim 3 wherein each of the third and fourth capacitor means is disposed substantially between the ports coupled by the associated strip conductor, and the associated strip conductor extends around and spaced from the associated bypass capacitor means.

5. A quadrature coupler comprising:
    input, direct, coupled and isolated ports;
    a first strip conductor coupling the input and direct ports;
    a second strip conductor coupling the isolated and coupled ports;
    first capacitor means coupled between an intermediate point of the first strip conductor and a reference voltage; and
    second capacitor means coupled between an intermediate point of the second strip conductor and the reference voltage.

6. A coupler according to claim 5 wherein the strip conductors are formed of interdigitated parallel strip conductor sections.

7. A coupler according to claim 6 wherein the strip conductors are coplanar and each capacitor means comprises spaced planar pad conductors with the planes of the pad conductors being parallel with the plane of the strip conductors.

8. A coupler according to claim 7 wherein each capacitor means is disposed substantially between the ports coupled by the associated strip conductor, and the associated strip conductor extends around and spaced from the associated bypass capacitor means.

* * * * *